(12) United States Patent
Fan

(10) Patent No.: US 7,819,689 B2
(45) Date of Patent: Oct. 26, 2010

(54) ELECTRICAL CONNECTOR ASSEMBLY WITH PICK UP CAP ALTERNATIVELY ATTACHED TO A HOUSING OR A COVER

(75) Inventor: Chia-Wei Fan, Tu-Cheng (TW)

(73) Assignee: Hon Hai Precision Inc. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/511,261

(22) Filed: Jul. 29, 2009

(65) Prior Publication Data

US 2010/0029108 A1    Feb. 4, 2010

(30) Foreign Application Priority Data

Jul. 29, 2008    (TW)    ................. 97213400

(51) Int. Cl.
*H01R 13/625*    (2006.01)
*H01R 13/62*    (2006.01)

(52) U.S. Cl. ...................... 439/345; 439/331

(58) Field of Classification Search .................. 439/345, 439/331, 940, 367, 342, 260
See application file for complete search history.

(56) References Cited

U.S. PATENT DOCUMENTS

| | | | |
|---|---|---|---|
| 7,708,571 B2 * | 5/2010 | Terhune et al. | 439/135 |
| 2009/0061652 A1 * | 3/2009 | Fan | 439/41 |
| 2010/0087082 A1 * | 4/2010 | Fan | 439/345 |

* cited by examiner

Primary Examiner—Chandrika Prasad
(74) Attorney, Agent, or Firm—Andrew C. Cheng; Wei Te Chung; Ming Chieh Chang

(57) ABSTRACT

An electrical connector assembly (100) for electrically connecting a CPU to a PCB, comprises an insulating housing (30), a metal frame (40) receiving the insulating housing, a metal cover (20) moveably assembled on the metal frame, a lever (50) rotatablely arranged on the metal frame to engage the metal cover with the metal frame. The insulating housing and the metal cover having several locking elements (31,21, 22), a pick up cap having several latches (11,12) and capable of attaching on the insulating housing or metal cover alternatively in different periods through by the latches engaging with the locking elements.

15 Claims, 7 Drawing Sheets

ELECTRICAL CONNECTOR ASSEMBLY WITH PICK UP CAP ALTERNATIVELY ATTACHED TO A HOUSING OR A COVER

BACKGROUND OF THE INVENTION

1. Field of the Invention

The present invention generally relates to an electrical connector assembly, and more particularly to an electrical connector assembly for removably mounting a chip module, such as a Central Processing Unit (CPU), to a printed circuit board (PCB).

2. Description of Related Art

Usually, an electrical connector is soldered to a PCB to achieve a good electrical connection between a CPU and the PCB. In order to meet with requirements of the automatic manufacturing, a pick up cap is installed on the electrical connector to be captured by a vacuum mechanism for movement of the electrical connector.

Commonly, the electrical connector comprises an insulating housing, a metal frame receiving the insulating housing, a metal cover installed on the metal frame and a lever engaging the metal cover with the metal frame. First, a plurality of contact terminals is received in the insulating housing, and then, a pick up cap is assembled on the insulating housing to automatically move the insulating housing by an automatic device. Second, the insulating housing is assembled into the metal frame and the metal cover is assembled on the metal frame to cover the insulating housing. Finally, the pick up cap is removed from the insulating housing to release room for a CPU to test the electrical performance of the electrical connector. In test, the CPU usually needs to be exchanged for several times in practice, and therefore, the terminals are exposed in the air throughout a central slot of the metal cover. So do the terminals in transportation. A protect cover is assembled on the metal cover to enclose the slot for protecting the terminals when the electrical connector is in test and in transportation.

But, the aforementioned method needs a pick up cap and a protect cover respectively installed on the insulating housing and the metal cover. It is rather troublesome and time-using and causes a waste of materials.

Therefore, it is desired to provide an improved electrical connector assembly to solve the problems mentioned above.

BRIEF SUMMARY OF THE INVENTION

Accordingly, an object of the present invention is to provide an electrical connector assembly with a multifunctional pick up cap which engages with the insulating housing and the metal cover respectively in different periods.

In order to achieve the above-mentioned object, an electrical connector assembly for electrically connecting a CPU to a printed circuit board, comprises an insulating housing, a metal frame receiving the insulating housing, a metal cover moveably assembled on the metal frame, a lever rotatably arranged on metal frame to engage the metal cover with the metal frame. The insulating housing and the metal cover having several locking elements, a pick up cap having several latches and capable of attaching on the insulating housing or metal cover respectively in different periods of assembling and testing through by the latches engaging with the locking elements.

Other objects, advantages and novel features of the invention will become more apparent from the following detailed description of the present embodiment when taken in conjunction with the accompanying drawings.

DETAILED DESCRIPTION OF THE INVENTION

Figure 1:
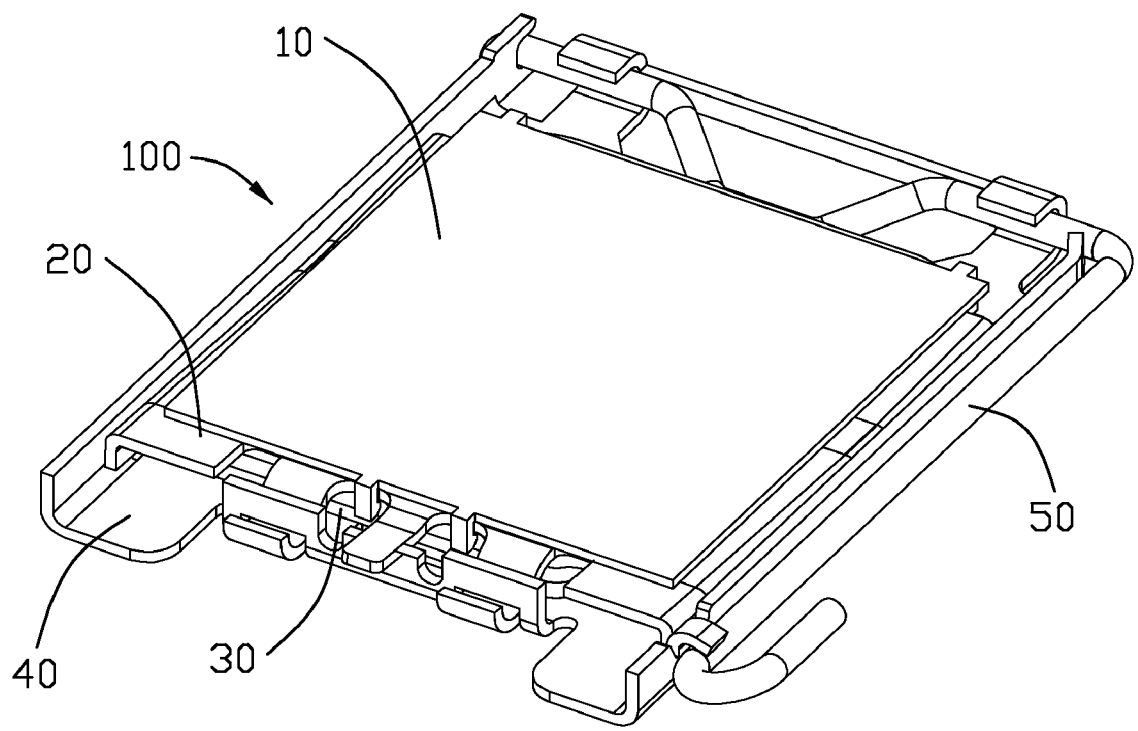
FIG. 1 is a perspective view of an electrical connector assembly with a pick up cap assembled on a metal cover.

Reference will now be made to the figures to describe the present invention in detail.

Please refer to FIGS. 1-7, an electrical connector assembly 100 in accordance with the preferred embodiment of the present invention is used for electrically connecting a chip module (not shown), such as a Central Processing Unit (CPU), with a printed circuit board (PCB, not shown). The electrical connector assembly 100 comprises an electrical connector (not labeled) connecting with the PCB and a pick up cap 10 installed on the electrical connector. The electrical connector comprises a metal frame 40, an insulating housing 30 accommodated in the metal frame 40, a plurality of terminals (not labeled) assembled in the insulating housing 30 for electrically connecting with the CPU, a metal cover 20 rotatablely fixed on one side of the metal frame 40 and a lever 50 rotatablely assembled on the opposite side of the metal frame 40 to engage the metal cover 20 with the metal frame 40. The multifunctional pick up cap 10 is alternatively installed on the insulating housing 30 or the metal cover 20.

Figure 2:
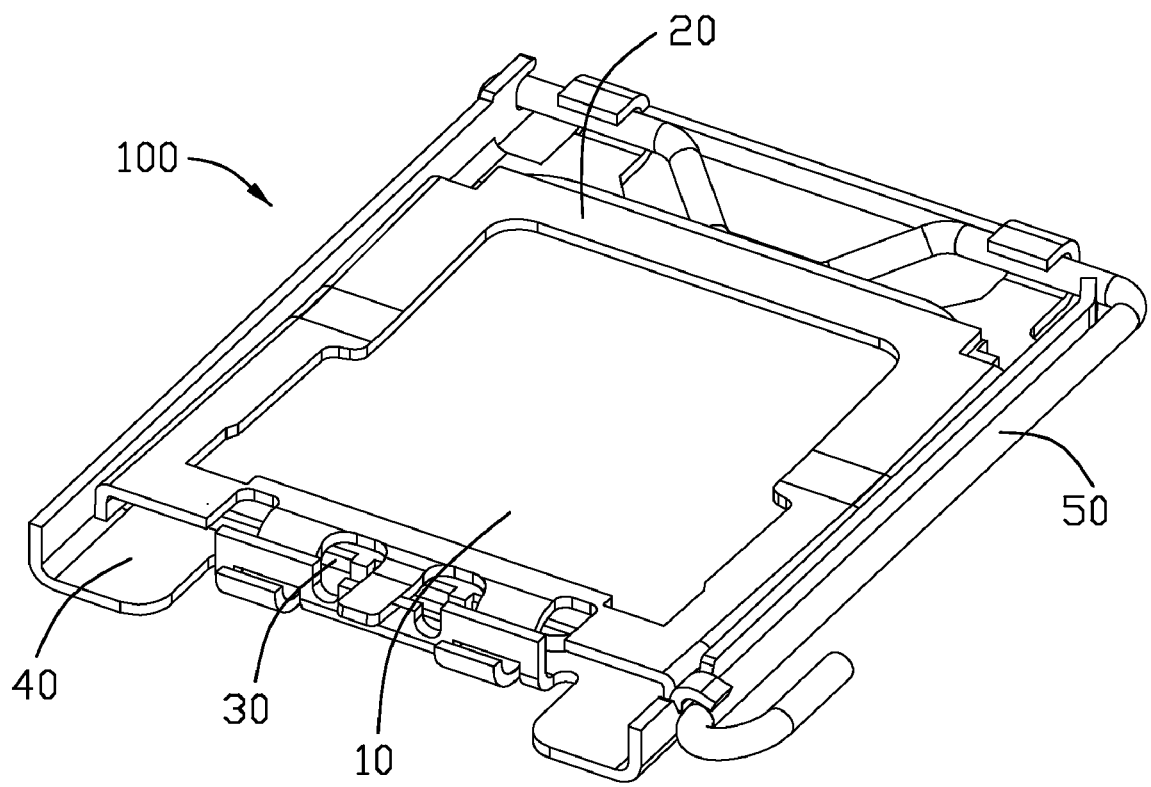
FIG. 2 is a perspective view of the electrical connector assembly with the pick up cap assembled on an insulating housing.
Figure 3:
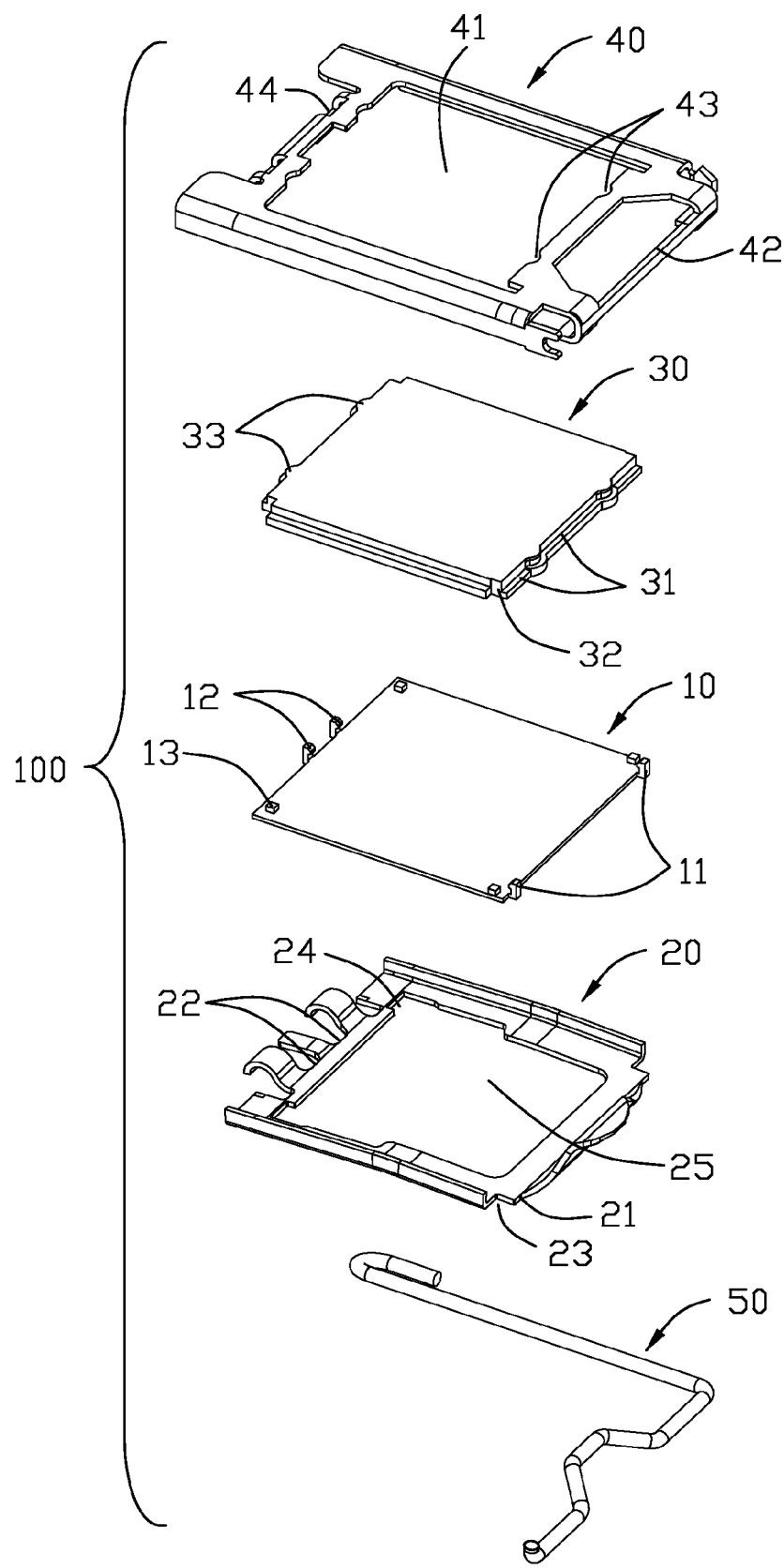
FIG. 3 is an exploded, perspective view of the electrical connector assembly.
Figure 4:
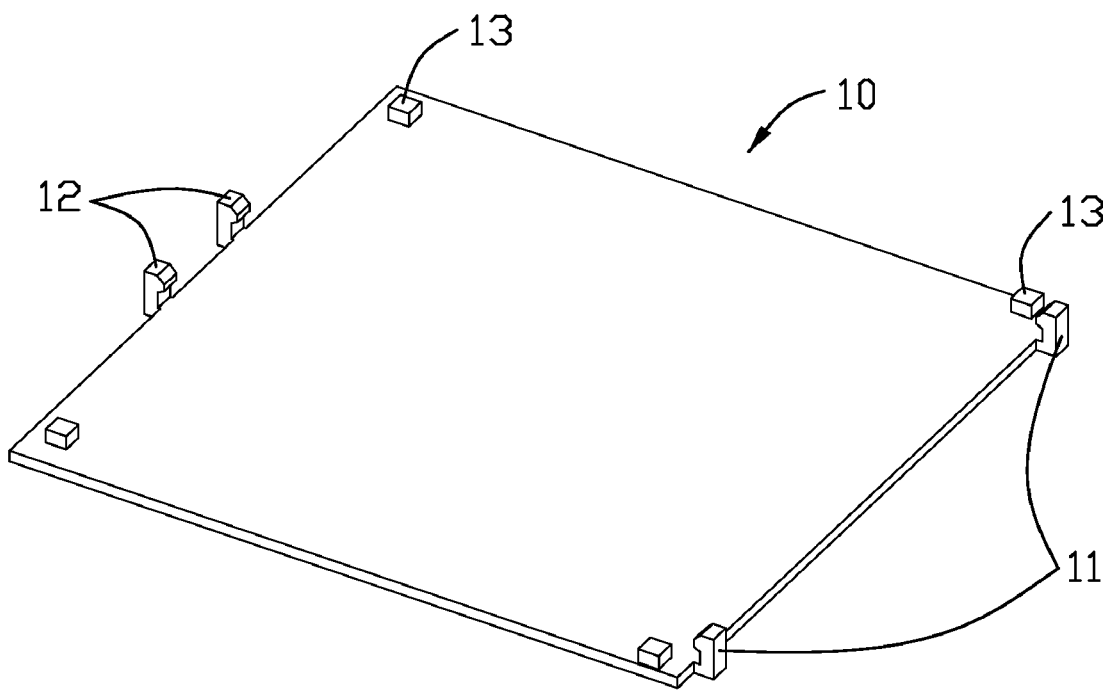
FIG. 4 is a perspective view of the pick up cap of the electrical connector assembly.

Please refer to FIGS. 1-3, the metal frame 40 is approximately a frame structure and comprises a pair of locking elements 44, 42 on two opposite sides thereof to rotatablely fix the metal cover 20 and the lever 50 respectively. A hole 41 is slotted on a center part of the metal frame 40 to allow the insulating housing 30 to be soldered with the PCB. The metal frame 40 defines several cutouts 43 surrounding and communicating with the hole 41.

Please refer to FIGS. 4-7, the pick up cap 10 is approximately a rectangle structure. The pick up cap 10 forms a plurality of posts 13 dispersedly located on the corners thereof and a plurality of latches 11, 12 extending from edges thereof along a same direction as the posts 13. The pair of first latches 11 is adjacent to two posts 13 at one side of the pick up cap 10 with a larger distance therebetween and the pair of second latches 12 is distant away from two posts 13 at the opposite side of the pick up cap 10 with a smaller distance therebetween.

Please refer to FIGS. 3-7, the insulating housing 30 forms a pair of step portions 31 at two opposite ends thereof for engaging with the latches 11, 12 of the pick up cap 10 and each step portions 31 protrudes a plurality of cams 33. the insulating housing 30 defines a guide gap 32 at each corner thereof for cooperating with the posts 13 of the pick up cap 10.

Figure 6:
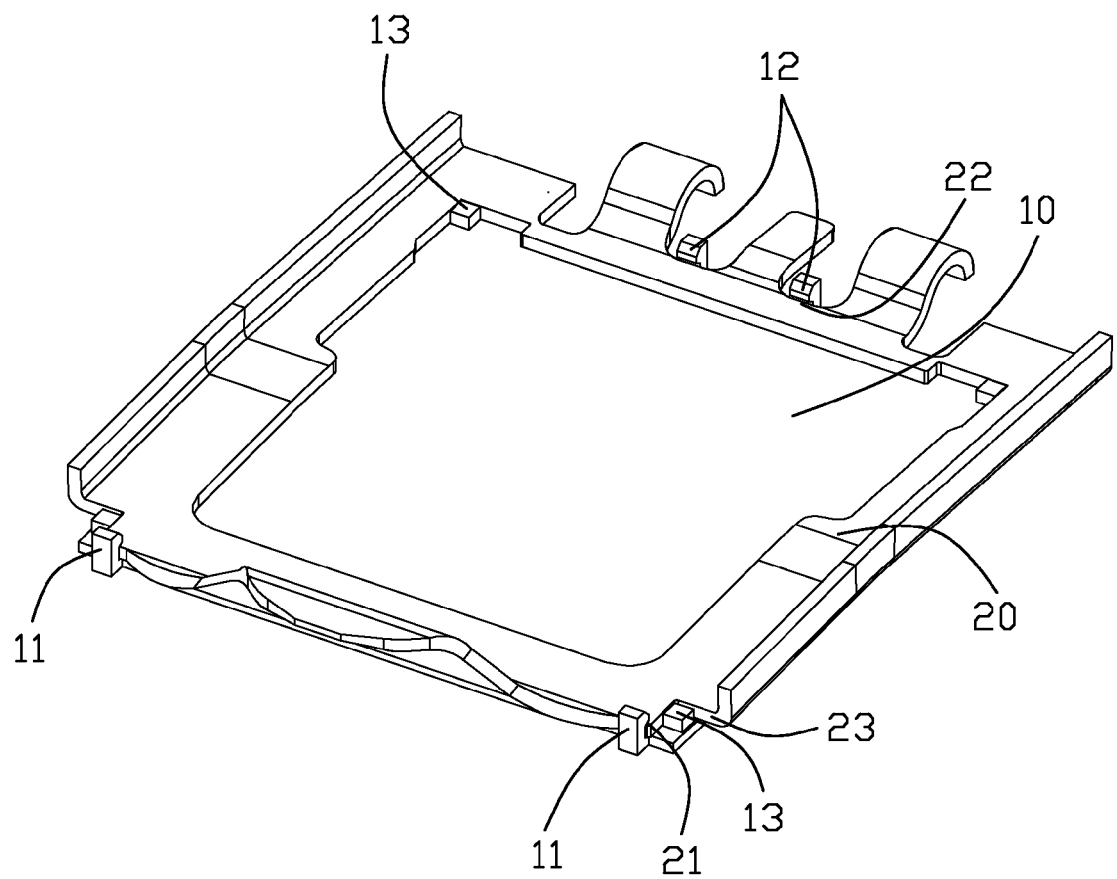
FIG. 6 is a perspective view of the pick up cap assembled with the metal cover.
Figure 7:
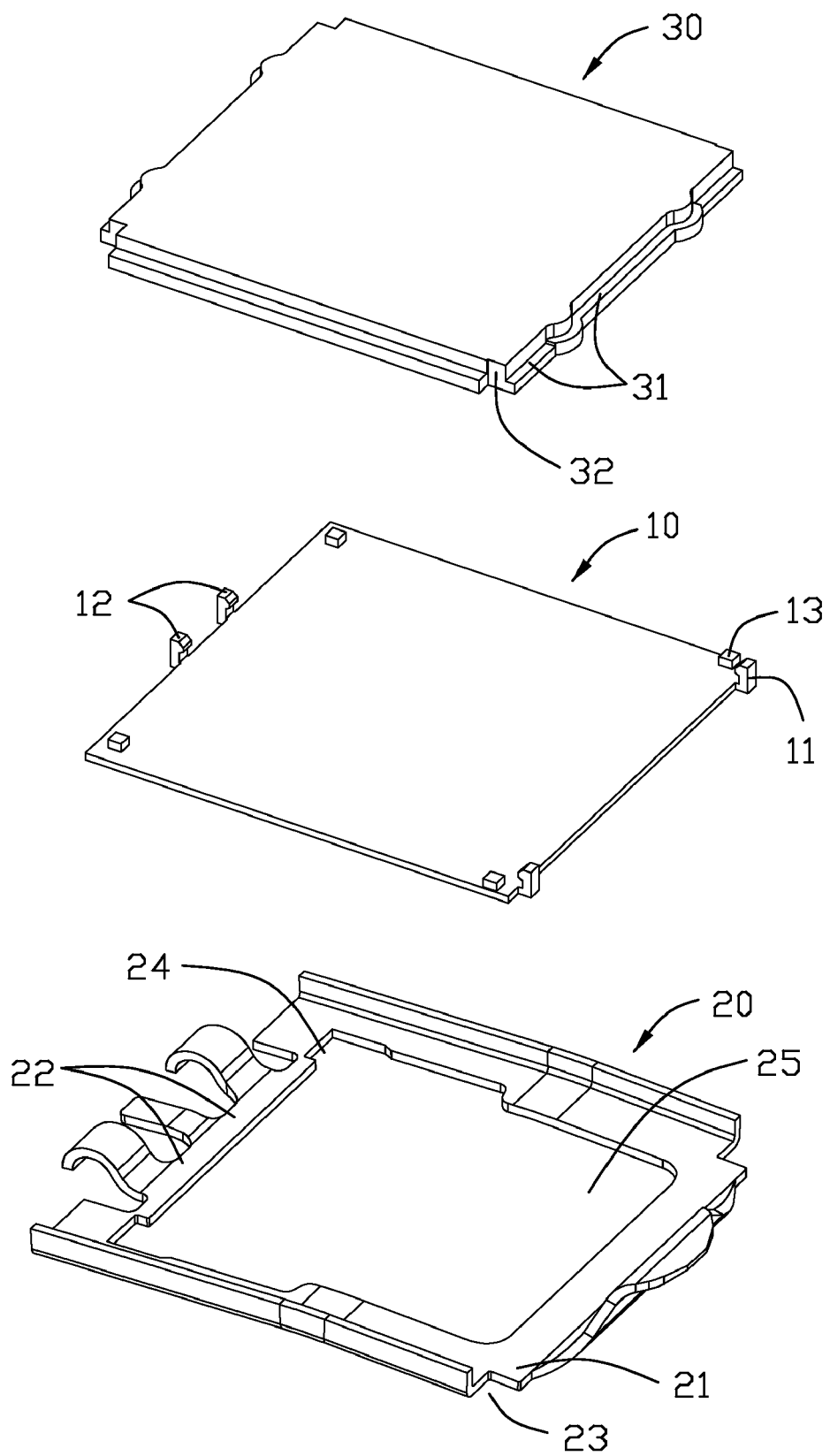
FIG. 7 is an exploded, perspective view of the pick up cap, the insulating housing and the metal cover.

Please refer to FIGS. 3, 6 and 7, the metal cover 20 is a frame structure and comprises a first fastening portion 21, a second fastening portion 22 and a pair of lateral walls (not labeled) corporately defining an aperture 25 therebetween. The metal cover 20 defines a pair of first slits 23 at two corners of one side thereof adjacent to the first fastening portions 21 and defines a pair of second slits 24 facing towards the aperture 25 at the opposite side thereof. The first and second slits 23,24 correspond to the guide gaps 32 of the insulating housing 30 along a vertical direction.

Figure 5:
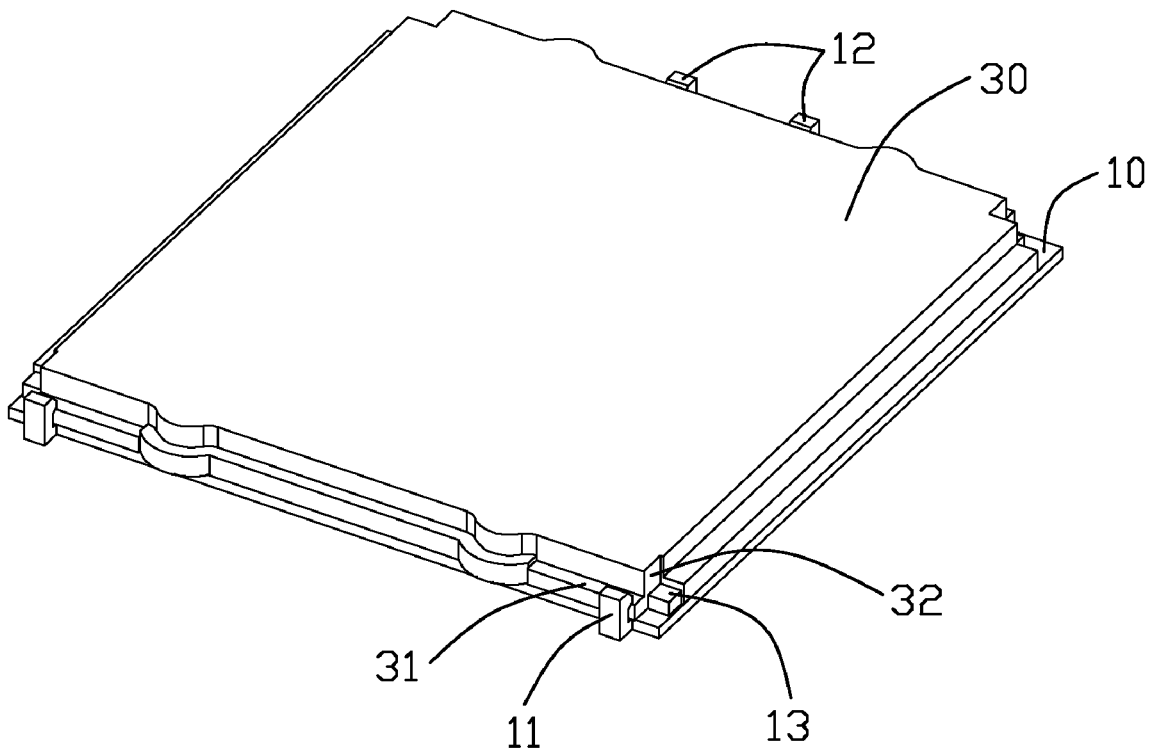
FIG. 5 is a perspective view of the pick up cap assembled with the insulating housing.

Please refer to FIGS. 5-7, when the pick up cap 10 is installed on the insulating housing 30, and then, the posts 13 of the pick up cap 10 are received in the guide gaps 32 of the insulating housing 30 and the latches 11, 12 engage with the step portion 31. When the pick up cap 10 is installed on the metal cover 20, the posts 13 of the pick up cap 10 is received in the slits 23,24 of the metal cover 20 and the latches 11,12 engage with the fastening portions 21,22.

Please refer to FIGS. 1-7, the assembling process is introduced as following. First, a plurality of terminals are assembled in the insulating housing 30, and then, the pick up cap 10 is installed on the insulating housing 30 and the insulating housing 30 is assembled in the metal frame 40 through a vacuum device capturing the pick up cap 10. Second, the metal cover 20 and the lever 50 are rotatablely assembled on two opposite sides of the metal frame 40. Finally, the electrical connector assembly 100 goes into test for electrical performance. The pick up cap 10 is removed from the insulating housing 30 and a CPU is assembled on the insulating housing 30 instead. In order to protect the terminals in the insulating housing 30, the pick up cap 10 which is removed from the insulating housing 30 is assembled on the metal cover 20 to enclose the aperture 25. Because of the pick up cap 10 comprises a plurality of posts 13 and a plurality of latches 11,12, the pick up cap 10 can alternatively engage with the insulating housing 30 and the metal cover 20 in different periods, and achieves an automatic operation and protects the terminals in test and in transportation.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector assembly for electrically connecting a CPU to a PCB, comprising:
   an insulating housing having step portions arranged edges thereof;
   a metal frame receiving the insulating housing and assembled on the PCB;
   a metal cover moveably assembled on the metal frame and comprising several fastening portions;
   a lever rotatably on the metal frame to engage the metal cover with the metal frame;
   a pick up cap alternatively attaching on the insulating housing and the metal cover in different periods.

2. The electrical connector assembly as claimed in claim 1, wherein the pick up cap comprises several latches alternatively engaging with the step portions of the insulating housing and the fastening portions of the metal cover.

3. The electrical connector assembly as claimed in claim 2, wherein the latches comprise first and second latches extending vertically from two opposite sides of the pick up cap respectively.

4. The electrical connector assembly as claimed in claim 3, wherein a distance between the pair of first latches arranged on one side of the pick up cap is larger than that of the pair of second latches arranged on the opposite side of the pick up cap.

5. The electrical connector assembly as claimed in claim 2, wherein the pick up cap has several posts extending vertically from each corner thereof along a same direction as the latches.

6. The electrical connector assembly as claimed in claim 5, wherein the insulating housing has several guide gaps on each corner thereof to mate with the posts of the pick up cap.

7. The electrical connector assembly as claimed in claim 6, wherein the metal cover defines several slits to mate with the posts of the pick up cap.

8. The electrical connector assembly as claimed in claim 7, wherein the metal cover defines an aperture and the pick up cap is assembled on the metal cover to enclose the aperture.

9. The electrical connector assembly as claimed in claim 8, wherein the pick up cap covers on the insulating housing in assembling process to move the insulating housing automatically by a vacuum device.

10. The electrical connector assembly as claimed in claim 9, wherein the pick up cap is removed from the insulating housing to assemble on the metal cover instead to enclose the aperture.

11. An electrical connector assembly, comprising:
    an insulating housing;
    a metal cover defining an aperture and moveably assembled on the insulating housing;
    a pick up cap having several latches extending vertically from sides thereof; and
    wherein the insulating housing and the metal cover having several engaging elements correspondingly engaging with the latches of the pick up cap, and the pick up cap attaching on the insulating housing and the metal cover alternatively in different periods.

12. The electrical connector assembly as claimed in claim 11, wherein the latches comprise a first and second latches extending vertically from two opposite sides of the pick up cap respectively.

13. The electrical connector assembly as claimed in claim 12, wherein the engaging elements comprise a plurality of step portions around of the insulating housing and several fastening portions arranged on the cover, and the step portions of the insulating housing and the fastening portions of the metal cover mate with the latches of the pick up cap in different periods.

14. The electrical connector assembly as claimed in claim 13, wherein the pick up cap has several posts extending vertically from each corner thereof.

15. The electrical connector assembly as claimed in claim 14, wherein the insulating housing defines several gaps and the metal cover defines several slits to mate with the posts of the pick up cap.

* * * * *